(12) United States Patent
Mori et al.

(10) Patent No.: US 10,443,113 B2
(45) Date of Patent: *Oct. 15, 2019

(54) SPUTTERING TARGET FOR FORMING PROTECTIVE FILM AND MULTILAYER WIRING FILM

(71) Applicant: MITSUBISHI MATERIALS CORPORATION, Tokyo (JP)

(72) Inventors: Satoru Mori, Okegawa (JP); Shozo Komiyama, Sanda (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/914,091

(22) PCT Filed: Oct. 10, 2014

(86) PCT No.: PCT/JP2014/077195
§ 371 (c)(1),
(2) Date: Feb. 24, 2016

(87) PCT Pub. No.: WO2015/068527
PCT Pub. Date: May 14, 2015

(65) Prior Publication Data
US 2016/0201188 A1    Jul. 14, 2016

(30) Foreign Application Priority Data

Nov. 6, 2013  (JP) ................................ 2013-230301

(51) Int. Cl.
*C22C 9/00* (2006.01)
*C22C 9/01* (2006.01)
(Continued)

(52) U.S. Cl.
CPC .................. *C22C 9/06* (2013.01); *C22C 9/00* (2013.01); *C22C 9/01* (2013.01); *C23C 14/00* (2013.01);
(Continued)

(58) Field of Classification Search
CPC ....... Y10T 428/12903; Y10T 428/1291; Y10T 428/12882; C22C 9/00; C22C 9/06;
(Continued)

(56) References Cited

U.S. PATENT DOCUMENTS 2,430,419 A   11/1947 Edens
2,901,692 A   8/1959 Kenneth
(Continued)

FOREIGN PATENT DOCUMENTS

CN   1341157 A    3/2002
CN   101698207 A   4/2010
(Continued)

OTHER PUBLICATIONS

Kadlec et al. in "Low pressure magnetron sputtering and selfsputtering discharges," in Vacuum, vol. 47, No. 3, 1996 (no month), pp. 307-311.*

(Continued)

*Primary Examiner* — Michael E. La Villa
(74) *Attorney, Agent, or Firm* — Locke Lord LLP; James E. Armstrong, IV; Nicholas J. DiCeglie, Jr.

(57) ABSTRACT

A sputtering target is provided for forming a protective film which is used for forming a protective film on a single surface or both surfaces of a Cu wiring film, the sputtering target including 5 to 15 mass % of Ni or Ni and Al in total (where the Ni content is 0.5 mass % or higher); 0.1 to 5.0 mass % of Mn; 0.5 to 7.0 mass % of Fe; and a balance including Cu and inevitable impurities.

2 Claims, 2 Drawing Sheets

(51) Int. Cl.

| | | |
|---|---|---|
| *C22C 9/06* | (2006.01) | |
| *C23C 14/34* | (2006.01) | |
| *H01J 37/34* | (2006.01) | |
| *C23C 14/14* | (2006.01) | |
| *C23C 14/00* | (2006.01) | |
| *C23C 14/16* | (2006.01) | |
| *C23C 30/00* | (2006.01) | |
| *C23C 28/02* | (2006.01) | |
| *C22C 9/05* | (2006.01) | |

(52) U.S. Cl.
CPC .............. *C23C 14/14* (2013.01); *C23C 14/16* (2013.01); *C23C 14/165* (2013.01); *C23C 14/34* (2013.01); *C23C 14/3407* (2013.01); *C23C 14/3414* (2013.01); *C23C 28/02* (2013.01); *C23C 28/021* (2013.01); *C23C 28/023* (2013.01); *C23C 30/00* (2013.01); *C23C 30/005* (2013.01); *H01J 37/3426* (2013.01); *C22C 9/05* (2013.01); *Y10T 428/1291* (2015.01); *Y10T 428/12882* (2015.01); *Y10T 428/12903* (2015.01)

(58) Field of Classification Search
CPC .. C22C 9/01; C22C 9/05; C23C 14/00; C23C 14/14; C23C 14/16; C23C 14/165; C23C 14/34; C23C 14/3407; C23C 14/3414; C23C 28/02; C23C 28/021; C23C 28/023; C23C 30/00; C23C 30/005; H01J 37/3426
See application file for complete search history.

(56) References Cited

U.S. PATENT DOCUMENTS

| | | | |
|---|---|---|---|
| 3,721,535 A | 3/1973 | Pryor et al. | |
| 3,901,692 A | 8/1975 | Mikawa | |
| 4,401,488 A * | 8/1983 | Prinz | C22C 9/01 148/435 |
| 5,422,150 A | 6/1995 | Scoular et al. | |
| 6,872,464 B2 | 3/2005 | Hubner et al. | |
| 7,297,419 B2 | 11/2007 | Watanabe | |
| 2005/0061857 A1 | 3/2005 | Hunt et al. | |
| 2007/0039817 A1* | 2/2007 | Daniels | B32B 15/012 204/298.12 |
| 2009/0297883 A1* | 12/2009 | Koppensteiner | B21C 37/042 428/675 |
| 2014/0227557 A1* | 8/2014 | Mori | H01J 37/3426 428/675 |
| 2014/0315043 A1* | 10/2014 | Mori | B32B 15/01 428/656 |
| 2015/0136595 A1 | 5/2015 | Maki et al. | |

FOREIGN PATENT DOCUMENTS

| | | | |
|---|---|---|---|
| CN | 101842852 | A | 9/2010 |
| CN | 102177273 | A | 9/2011 |
| CN | 102560187 | A | 7/2012 |
| CN | 102870072 | A | 1/2013 |
| CN | 103151090 | A | 6/2013 |
| DE | 650931 | C | 10/1937 |
| JP | H01-222047 | A | 9/1989 |
| JP | H01-252516 | A | 10/1989 |
| JP | H05-036401 | A | 2/1993 |
| JP | H05222472 | A | 8/1993 |
| JP | 2002-294437 | A | 10/2002 |
| JP | 2005-206861 | A | 8/2005 |
| JP | 2006-241587 | A | 9/2006 |
| JP | 2008-311283 | A | 12/2008 |
| JP | 2012-193444 | A | 10/2012 |
| JP | 2013-133489 | A | 7/2013 |
| KR | 10-2006-0037247 | A | 5/2006 |
| WO | WO 9504368 | * | 2/1995 |

OTHER PUBLICATIONS

Machine Translation, Takahashi, et al., JP 2013-133489, Jul. 2013.*
Machine Translation, Daniels, et al., KR 1020060037247 A, May 2006.*
Machine Translation, Susumu et al., JP 01-222047, Sep. 1989.*
Machine Translation, Hideyuki et al., CN 102870072, Jan. 2013.*
Machine Translation, Yoshihiro et al., JP 05-222472, Aug. 1993.*
International Search Report dated Dec. 16, 2014, issued for PCT/JP2014/077195 and English translation thereof.
Office Action dated Mar. 22, 2016, issued for the Taiwanese patent application No. 103135821 and partial English translation of the search report.
Office Action dated May 2, 2016, issued for the Korean patent application No. 10-2016-7006552 and English translation thereof.
Office Action issued in corresponding U.S. Appl. No. 14/090,203, dated Dec. 31, 2014.
Office Action issued in corresponding U.S. Appl. No. 14/090,203, dated Feb. 2, 2016.
Office Action issued in corresponding Japanese Patent Application No. JP 2013-027046, dated Apr. 26, 2016.
Office Action issued in corresponding Chinese Patent Application No. CN 201480046016.4, dated Aug. 3, 2016.
Notice of Allowance issued in related U.S. Appl. No. 14/090,203, dated Aug. 30, 2016.
Office Action / Search Report issued in corresponding Chinese Patent Application No. CN201310545415.2, dated Nov. 4, 2016.
Notification of the Second Office Action issued in corresponding Chinese Patent Application No. CN 201480046016.4, dated Feb. 13, 2017.

* cited by examiner

SPUTTERING TARGET FOR FORMING PROTECTIVE FILM AND MULTILAYER WIRING FILM

TECHNICAL FIELD

The present invention relates to a sputtering target for forming a protective film used for forming a protective film that protects a Cu wiring film formed of copper or a copper alloy; and a multilayer wiring film including a protective film that is formed using the sputtering target for forming a protective film.

Priority is claimed on Japanese Patent Application No. 2013-230301, filed Nov. 6, 2013, the content of which is incorporated herein by reference.

BACKGROUND ART

In the related art, aluminum (Al) widely used as a wiring film of a flat panel display such as a liquid crystal panel or an organic EL panel and as a wiring film of a touch panel or the like. Recently, the size (width) and thickness of a wiring film has been reduced, and there has been a demand for a wiring film having a lower specific resistance than that in the related art.

Along with the above-described reduction in the size and thickness of a wiring film, a wiring film formed of copper or a copper alloy, which is a material having a lower specific resistance than Al, has been provided.

However, a Cu wiring film which is formed of copper or a copper alloy having a low specific resistance has a problem in that it easily discolors in a humid atmosphere. In a case where a copper alloy containing a large amount of additive elements is used to improve weather resistance, the specific resistance increases.

Therefore, for example, PTL 1 discloses a layered film in which a protective film formed of a Ni—Cu—(Cr, Ti) alloy is formed on a Cu wiring film; and a sputtering target for forming the protective film. This protective film has higher weather resistance than copper and thus can suppress the discoloration of a surface of the layered film even when the layered film is stored in the air.

CITATION LIST

Patent Literature

[PTL 1] Japanese Unexamined Patent Application, First Publication No. 2012-193444

DISCLOSURE OF INVENTION

Technical Problem

However, in a case where a Cu wiring film formed of copper or a copper alloy is patterned by etching, an etchant containing iron chloride is used. In a case where the above-described layered film including the protective film formed of a Ni—Cu—(Cr, Ti) alloy is etched with an etchant containing iron chloride, a portion of the protective film may remain as a residue without being melted. Since this residue may cause short-circuiting between wirings, it is difficult to use the above-described layered film as a wiring film.

In addition, in a case where the layered film contains Cr, waste liquid after etching contains Cr, and thus there is a problem in that costs are incurred to treat the waste liquid.

Further, since the layered film contains relatively expensive Ni in a large amount of 35 to 84.5 mass %, there is a problem in that the manufacturing costs of the sputtering target and the multilayer wiring film increase.

In addition, the sputtering target is manufactured through, for example, steps of casting and hot rolling. However, when cracking occurs during hot rolling, abnormal discharge occurs at the crack. Therefore, the sputtering target not be used as a sputtering target. Recently, the size of a glass substrate on which a wiring film is formed has increased, and the size of a sputtering target also tends to increase accordingly. Here, when a portion of a hot-rolled material cracks during the manufacturing of a large sputtering target, a sputtering target having a predetermined size cannot be obtained. Therefore, in order to efficiently produce a large sputtering target, superior hot rolling characteristics are required.

The present invention has been made in consideration of the above-described circumstances. According to the present invention, a protective film which has superior weather resistance, can suppress surface discoloration, and has superior etchability can be formed. An object of the present invention is to provide a sputtering target for forming a protective film which is formed of a copper alloy having superior hot workability; and a multilayer wiring film including a protective film that is formed using the sputtering target for forming a protective film.

Solution to Problem

According to a first aspect of the present invention for solving the above-described problems, a sputtering target is provided for forming a protective film which is used for forming a protective film on a single surface or both surfaces of a Cu wiring film, the sputtering target including 5 to 15 mass % of Ni or Ni and Al in total (where the Ni content is 0.5 mass % or higher); 0.1 to 5.0 mass % of Mn; 0.5 to 7.0 mass % of Fe; and a balance including Cu and inevitable impurities.

The sputtering target for forming a protective film according to the present invention having the above-described configuration is formed of a Cu-based alloy and, as described above, has a composition including 5 to 15 mass % of Ni or Ni and Al in total (where the Ni content is 0.5 mass % or higher); 0.1 to 5.0 mass % of Mn; 0.5 to 7.0 mass % of Fe; and a balance including Cu and inevitable impurities. Therefore, even in a case where the formed protective film is etched with an etchant containing iron chloride, the etching can be performed as in the case of a Cu wiring film, and the production of an unmelted residue can be suppressed.

Further, since the sputtering target for forming a protective film does not contain Cr, waste liquid after etching can be treated at a low cost.

In addition, the Ni content or the sum of the Ni content and the Al content is 15 mass % or lower, which is relatively low. Therefore, the manufacturing costs of the sputtering target and the protective film can be significantly reduced. In addition, hot workability and machinability can be secured.

Further, the Ni content is 0.5 mass % or higher. Therefore, hot rolling characteristics can be improved, and cracking can be suppressed during hot rolling.

Al is an element which is selectively added instead of a portion of Ni and may be appropriately added according to the Ni content. That is, in a case were the Ni content is 5 mass % or higher, Al is not necessarily added, and Al is optionally added such that the sum of the Al content and the Ni content is in a range of 5 to 15 mass %.

According to a second aspect of the present invention, a multilayer wiring film is provided, including a Cu wiring film; and a protective film that is formed on a single surface or both surfaces of the Cu wiring film, in which the protective film is formed using the above-described sputtering target for forming a protective film.

The multilayer wiring film according to the present invention having the above-described configuration includes a protective film that is formed using the sputtering target for forming a protective film having the above-described composition. Therefore, weather resistance is improved, and discoloration can be suppressed in the case of being stored in the air.

In addition, the protective film is formed of a Cu-based alloy. Therefore, even in a case where the formed protective film is etched with an etchant containing iron chloride, the production of an unmelted cited residue can be suppressed.

Further, since the sputtering target for forming a protective film does not contain Cr, waste liquid after etching can be treated at a low cost. Further, the Ni content is 15 mass % or lower at a maximum, which is relatively low. Therefore, the manufacturing cost of the multilayer wiring film can be significantly reduced.

Advantageous Effects of Invention

As described above, with the sputtering target for forming a protective film according) the present invention, a protective film which has superior weather resistance, can suppress surface discoloration, and has superior etchability can be formed. Further, it is possible to provide a sputtering target for forming a protective film which is formed of a copper alloy having superior hot workability; and a multilayer wiring film including a protective film that is formed using the sputtering target for forming a protective film.

BEST MODE FOR CARRYING-OUT THE INVENTION

Figure 1:
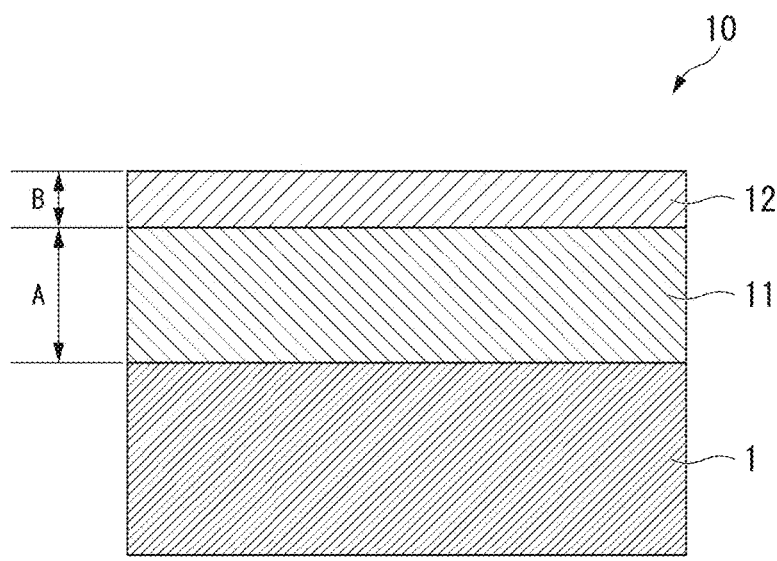
FIG. 1 is a cross-sectional view showing a multilayer wiring film according to an embodiment of the present invention.

Hereinafter, a sputtering target for forming a protective film a multilayer wiring film according to an embodiment of the present invention will be described.

The sputtering target for forming a protective film according to the embodiment is used for forming a protective film on a Cu wiring film which is formed of copper or a copper alloy.

This sputtering target for forming a protective film has a composition including 5 to 15 mass % of Ni or Ni and Al in total (where the Ni content is 0.5 mass % or higher); 0.1 to 5.0 mass % of Mn; 0.5 to 7.0 mass % of Fe; and a balance including Cu and inevitable impurities.

The sputtering target for forming a protective film is manufactured through steps of casting, hot rolling, cold rolling, heat treatment, and machining.

Hereinafter, the reason for limiting the composition of the sputtering target for forming a protective film according to the embodiment as described above will be described.

(Ni Content or Sum of Ni Content and Al Content: 5 to 15 Mass %)

Ni is an element an effect of improving the weather resistance of Cu. By adding Ni, the discoloration of the formed protective film can be prevented.

Similarly to Ni, Al is an element which has an effect of improving the weather resistance of Cu. Even when Al is added instead of a portion of Ni, the discoloration of the formed protective film can be suppressed.

Al is less expensive than Ni. Therefore, when Al is added instead of Ni, the cost can be reduced, and thus Al can be optionally added.

Here, in a case where the Ni content or the sum of the Ni content and the Al content is lower than 5 mass %, weather resistance is not sufficiently improved, and the discoloration of the formed protective film may not be sufficiently suppressed. On the other hand, in a case where the Ni content or the sum of the Ni content and the Al content is higher than 15 mass %, etchability deteriorates. Therefore, when etching is performed using an etchant containing iron chloride, an unmated residue may be produced. In addition, hot workability and machinability deteriorate.

Due to the above-described reasons, the Ni content or the sum of the Ni content and the Al content is set in a range of 0.5 to 15 mass %. The Ni content or the sum of the Ni content and the Al content is preferably 6.3 to 12.0 mass % and more preferably 7.8 to 10.4 mass % but is not limited thereto.

(Ni: 0.5 Mass % or Higher)

By adding an appropriate amount of Ni, hot workability is improved.

Here, in a case where the Ni content is lower than 0.5 mass %, hot workability is not sufficiently improved, cracking occurs during hot rolling, and it may be difficult to manufacture a large sputtering target.

The reason for this is that the Ni content is set to be 0.5 mass % or higher. The upper limit of the Ni content may be 11.5 mass %. The Ni content is preferably 0.7 to 11.5 mass % and more preferably 1.0 to 10.2 mass % but is not limited thereto.

(Mn: 0.1 to 5.0 Mass %)

Mn is an element which has an effect of improving the fluidity of molten metal to improve hot workability.

Here, in a case where the Mn content is lower than 0.1 mass %, the fluidity of molten metal is not sufficiently improved, cracking occurs during hot rolling, and a large sputtering target may not be manufactured with high yield. On the other hand, in a case where Mn content is higher than 5.0 mass %, etchability deteriorates. Therefore, when etching is performed using an etchant containing iron chloride, an unmelted residue may be produced.

The reason for this is that the Mn content is set in a range of 0.1 to 5.0 mass %. The Mn content is preferably 0.3 to 3.5 mass % and more preferably 0.5 to 2.5 mass % but is not limited thereto.

(Fe: 0.5 to 7.0 Mass %)

Fe is an element which has an effect of reducing the size of a metallographic structure to improve hot workability.

Here, in a case where the Fe content is lower than 0.5 mass %, the improvement of hot workability caused by reducing the size of a metallographic structure is insufficient, cracking occurs during hot rolling, and a large sputtering target may not be manufactured with high yield. On the other hand, in a case where the Fe content is higher than 7.0 mass %, hot workability and weather resistance may deteriorate.

The reason for this is that the Fe content is set in a range of 0.5 to 7.0 mass %. The Fe content is preferably 0.8 to 5.0 mass % and more preferably 1.0 to 4.0 mass % but is not limited thereto.

Next, a multilayer wiring film 10 according to the embodiment will be described.

As shown in FIG. 1, the multilayer wiring film 10 according to the embodiment includes a Cu wiring film 11 that is formed on a substrate 1; and a protective film 12 that is formed on the Cu wiring film 11.

Here, the substrate 1 is not particularly limited and is formed of glass or a resin film so as to allow permeation of light in, for example, a flat panel display or a touch panel.

The Cu wiring film 11 is formed of copper or a copper alloy, and the specific resistance thereof is preferably 4.0 μΩcm or lower (temperature: 25° C.). In the embodiment, the Cu wiring film 11 is formed of oxygen-free copper having a purity of 99.99 mass % or higher, and the specific resistance thereof is 3.5 μΩcm or lower (temperature: 25° C.). The Cu wiring film 11 is formed using a sputtering target which is formed of oxygen-free copper having a purity of 99.99 mass % or higher.

In addition, a thickness A of the Cu wiring film 11 is preferably in a range of 50 nm≤A≤800 nm and more preferably in a range of 100 nm≤A≤300 nm.

The protective film 12 is formed using the sputtering target for forming a protective film according to the embodiment and has the same composition as the above-described sputtering target for forming a protective film.

In addition, a thickness B of the protective film 12 is preferably in a range of 5 nm≤B≤100 nm and more preferably in a range of 10 nm≤B≤50 nm.

In addition, a ratio B/A of the thickness B of the protective film 12 to the thickness A of the Cu wiring film 11 is preferably in a range of 0.02<B/A<1.0 and more preferably in a range of 0.1<B/A<0.3.

The sputtering target for forming a protective film and the multilayer wiring film 10 according to the embodiment having the above-described configuration is formed of a Cu-based alloy and, as described above, has a composition including 5 to 15 mass % of Ni or Ni and Al in total (where the Ni content is 0.5 mass % or higher); 0.1 to 5.0 mass % of Mn; 0.5 to 7.0 mass % of Fe; and a balance including Cu and inevitable impurities. Therefore, even in a case where the formed protective film is etched with an etchant containing iron chloride, the etching can be performed favorably and the production of an unmelted residue can be suppressed.

In addition, the sputtering target for forming a protective film and the protective film 12 contain Ni and Al in the above-described range. Therefore, weather resistance is improved, and the surface discoloration of the multilayer wiring film 10 can be reliably suppressed.

Further, since the sputtering target for forming a protective film and the protective film 12 do not contain Cr, waste liquid after etching can be treated at a low cost.

In addition, the Ni content or the sum of the Ni content and the Al content is 15 mass % or lower, and the Ni content is 15 mass % or lower at a maximum which is relatively low. Therefore, the manufacturing costs of the sputtering target for forming a protective film and the multilayer wiring film 10 can be significantly reduced. Further, in a case where Al is added instead of a portion of Ni, the Ni content can be further reduced. Therefore, the manufacturing costs of the sputtering target for forming a protective film and the multilayer wiring film 10 can be further reduced.

In addition, the Ni content or the sum of the Ni content and the Al content is 15 mass % or lower. Therefore, hot workability and machinability can be secured.

In addition, the Ni content s 0.5 mass % or higher. Therefore, hot workability can be sufficiently improved.

Further, the Mn content is in a range of 0.1 to 5.0 mass %. Therefore, hot workability can be improved by improving molten metal fluidity during casting.

In addition, the Fe content is in a range of 0.5 to 7.0 mass %. Therefore, hot workability can be improved by sufficiently reducing the size of a metallographic structure.

In this way, in the sputtering target for forming a protective film according to the present invention, hot workability is sufficiently improved. Therefore, cracking can be suppressed during hot rolling, and a large sputtering target can be manufactured with high yield.

In addition, in the embodiment, the Cu wiring film 11 is formed of oxygen-free copper having a specific resistance of 3.5 μΩcm or lower temperature: 25'C.). The thickness A of the Cu wiring film 11 is in a range of 50 nm≤A≤800 nm. Therefore, due to the Cu wiring film 11, a current can be caused to flow favorably.

Further, in the embodiment, the thickness B of the protective film 12 is in a range of 5 nm≤B≤100 nm, and the ratio B/A of the thickness B of the protective film 12 to the thickness A of the Cu wiring film 11 is in a range of 0.02<B/A<1.0. Therefore the discoloration of the Cu wiring film 11 can be reliably suppressed.

The embodiment of the present invention has been described above. However, the present invention is not limited to the embodiment, and various modifications can be made within a range not departing from the technical idea of the present invention.

For example, in the embodiment, the structure in which the multilayer wiring film is formed on the substrate has been described as an example. However, the present invention is not limited to this structure. A transparent conductive film such as an ITO film or an AZO film may be formed on the substrate, and the multilayer wrong film may be formed on the transparent conductive film.

In addition, in the above description, the Cu wiring film is formed of oxygen-free copper having a purity of 99.99 mass % or higher, but the present invention is not limited thereto. For example, the Cu wiring film may be formed of pure copper such as tough pitch copper or formed of a copper alloy containing a small amount of additive elements.

Further, the thickness A of the Cu wiring film, the thickness B of the protective film, and the thickness ratio B/A are not limited to the embodiment, and other configurations may be adopted.

Examples

Hereinafter, the results of an evaluation test will be described in which the effects of the sputtering target for forming a protective film and the multilayer wiring film according to the present invention were evaluated.

<Pure Copper Target for Forming Cu Wiring Film>

An ingot formed of oxygen-free copper having a purity of 99.99 mass % was prepared. By performing hot rolling, stress relief annealing, and machining on the ingot, a pure copper target for forming a Cu wiring film having an outer diameter of 100 mm and a thickness of 5 mm was prepared.

Next, a backing plate formed of oxygen-free copper was prepared. The above-described pure copper target for forming a Cu wiring film was layered on the backing plate formed of oxygen-free copper. The components were joined to each other through indium soldering at a temperature of 200° C. As a result, a target with the backing plate was prepared.

<Sputtering Target for Forming Protective Film>

As raw materials to be melted, oxygen-free copper (purity: 99.99 mass % or higher), low-carbon nickel (purity: 99.9 mass % or higher), electrolytic manganese (purity: 99.9 mass % or higher), and electrolytic iron (purity: 99.95 mass % or higher) were prepared. These raw materials were melted by high-frequency melting in a purity graphite crucible such that the components thereof were adjusted to obtain molten metal having composition shown in Table 1. Next, the molten metal with the adjusted components was cast into a cooled carbon casting mold to obtain an ingot having a size of 50 mm×50 mm×30 mm.

Next, the ingot was hot-rolled into a thickness of 15 mm at a rolling reduction of 10% at a temperature of 750° C. to 850° C. After hot rolling, an oxide or a scratch on the surface was removed by cutting, was cold-rolled into a thickness of 10 mm at a rolling reduction of 10%, and was stress-relief-annealed. The surface of the obtained rolled sheet was machined. As a result, sputtering targets for forming a protective film according to Examples 1-9 and Comparative Examples 1-9 having an outer diameter of 100 mm and a thickness of 5 mm were prepared. Further, as Conventional Example 1, a sputtering target containing 64 mass % of Ni, 4 mass of Ti, and a balance including Cu and inevitable impurities was prepared.

Next, a backing plate formed of oxygen-free copper was prepared. The obtained sputtering target for forming a protective film was layered on the backing plate formed of oxygen-free copper. The components were joined to each other through indium soldering at a temperature of 200° C. As a result, a target with the backing plate was prepared.

Here, regarding the sputtering targets for forming a protective of Examples 1 to 9 and Comparative Examples 1 to 9, whether or not cracking occurred during hot rolling was determined. The results are shown in Table 1.

<Multilayer Wiring Film>

The pure copper target for forming a Cu wiring film was set in a sputtering device such that the distance from a glass substrate (a gas substrate 1737 (manufactured by Corning Inc.) having a length of 20 mm, a width of 70 mm, and a thickness of 0.7 mm) was 70 mm. Sputtering was performed under conditions of power supply: DC type, sputtering power: 150 W, ultimate vacuum: $5\times10^{-5}$ Pa, atmosphere gas composition: pure Ar, sputtering gas pressure: 0.67 Pa, and substrate heating: none. As a result, a Cu wiring film having a thickness of 150 nm was formed on the surface of the glass substrate.

Next, under the above-described conditions, sputtering was perform d using the sputtering target for forming a protective film shown in Table 1. As a result, a protective film having a thickness of 30 nm was formed on the Cu wiring film. In this way, multilayer wiring films according to Examples 11 to 19 and Comparative Examples 11 to 19 shown in Table 2 were formed.

As Conventional Example 11, sputtering was performed using the above-described sputtering target of Conventional Example 1. As a result, a multilayer wiring film which a protective film was formed on the Cu wiring film was prepared.

<Adhesion>

In a cross-cut adhesion test according to JIS-K5400, notches were formed in a grid shape at intervals of 1 mm to the multilayer wiring film, and scotch tape (manufactured by 3M Company) was attached to the multilayer wiring film and was peeled off to measure the area ratio (%) of the multilayer wiring film, which was attached to a 10 mm×10 mm region of the center of the glass substrate, to the glass substrate. The results are shown in Table 2.

<Weather Resistance>

In a temperature- and humidity-controlled test (exposed for 250 hours under conditions of temperature: 60° C. and relative humidity: 90%), a black surface (where the multilayer wiring film was not formed) of the glass substrate was observed by visual inspection to determine whether or not the discoloration of the Cu wiring film occurred. A case where black spots were formed was determined as "discoloration". A case where discoloration was observed was represented by "NG", and a case where discoloration was not observed was represented by "OK". The results are shown in Table 2.

<Etching Residue>

A photoresist solution (OFPR-8600LB, manufactured by Tokyo Ohka Kogyo Co., Ltd.) was applied to the multilayer wiring film formed on the glass substrate 13, was exposed, and was developed to form a resist film in a 30 µm line-and-space pattern. The multilayer wiring film was etched by being dipped in a 4% $FeCl_3$ aqueous solution held at a temperature of 30° C.±1° C., and wiring was formed.

Figure 2:
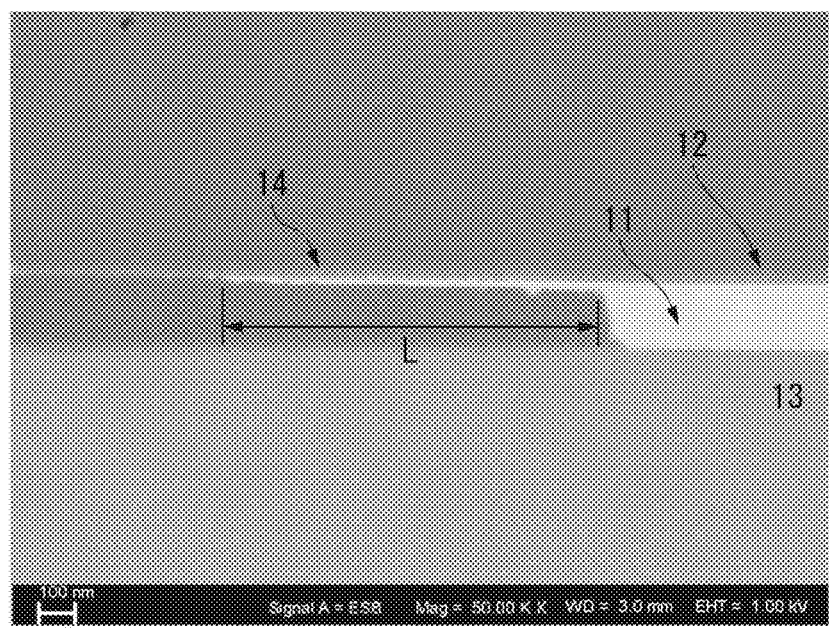
FIG. 2 is an image showing an evaluation criterion of an etching residue in Examples.

A cross-section of the wiring was observed through the following steps of vertically irradiating a sample exposed from a masking shield with Ar ion beams to perform ion etching; and observing the obtained cross-section with a secondary ion microscope. Then, whether or not etching residue remained was investigated. FIG. 2 shows an example of the observation result for an etching residue. Here, a case where the length L of a residue 14 was 300 nm or longer was evaluated as "B", and a case where the length L of the residue 14 was shorter than 300 nm was evaluated as "A". The results are shown in Table 2.

<Etching Rate>

Next, under the same conditions s described above, sputtering was performed using the sputtering target for forming a protective film. As a result, a protective film 12 having a thickness of 150 nm was formed on the above-described glass substrate 13. The glass substrate 13 on which only a monolayer of the protective film was formed was dipped in a 4% $FeCL_3$ aqueous solution, held at a temperature of 30° C.±1° C., to etch the protective film 12. At this time, the time required to remove the protective film 12 was measured by visual inspection to measure an etching rate.

TABLE 1

| | | Component Composition (mass %) | | | | | | Cracking During |
| --- | --- | --- | --- | --- | --- | --- | --- | --- |
| | | Ni | Mn | Fe | Al | Ni + Al | Cu | Hot Rolling |
| Example | 1 | 10.0 | 0.7 | 1.5 | — | 10.0 | Balance | Not Occurred |
| | 2 | 5.1 | 0.9 | 1.4 | — | 5.1 | Balance | Not Occurred |
| | 3 | 14.8 | 0.7 | 1.3 | — | 14.8 | Balance | Not Occurred |

TABLE 1-continued

|  |  | Component Composition (mass %) |  |  |  |  |  | Cracking During |
|---|---|---|---|---|---|---|---|---|
|  |  | Ni | Mn | Fe | Al | Ni + Al | Cu | Hot Rolling |
|  | 4 | 9.9 | 0.1 | 1.4 | — | 9.9 | Balance | Not Occurred |
|  | 5 | 10.1 | 4.4 | 1.3 | — | 10.1 | Balance | Not Occurred |
|  | 6 | 10.2 | 0.6 | 0.6 | — | 10.2 | Balance | Not Occurred |
|  | 7 | 9.8 | 0.7 | 6.4 | — | 9.8 | Balance | Not Occurred |
|  | 8 | 0.5 | 1.6 | 2.9 | 5.0 | 5.5 | Balance | Not Occurred |
|  | 9 | 7.0 | 0.7 | 1.3 | 7.0 | 14.0 | Balance | Not Occurred |
| Comparative | 1 | 3.5 | 0.8 | 1.4 | — | 3.5 | Balance | Not Occurred |
| Example | 2 | 17.5 | 0.8 | 1.3 | — | 17.5 | Balance | Occurred |
|  | 3 | 9.8 | 0.02 | 1.4 | — | 9.8 | Balance | Occurred |
|  | 4 | 11.0 | 6.5 | 1.3 | — | 11.0 | Balance | Not Occurred |
|  | 5 | 10.9 | 0.6 | 0.2 | — | 10.9 | Balance | Occurred |
|  | 6 | 9.7 | 0.8 | 8.5 | — | 9.7 | Balance | Occurred |
|  | 7 | 2.0 | 1.2 | 3.5 | 2.0 | 4.0 | Balance | Not Occurred |
|  | 8 | 8.0 | 0.3 | 4.2 | 8.0 | 16.0 | Balance | Occurred |
|  | 9 | — | 4.0 | 5.0 | 15.0 | 15.0 | Balance | Occurred |
| Conventional Example 1 |  | Cu—64.0 mass % Ni—4.0 mass % Ti |  |  |  |  |  | Not Occurred |

TABLE 2

|  |  | Sputtering Target for Forming Protective Film | Adhesion (%) | Weather Resistance | Etching Residue | Etching Rate (nm/sec.) |
|---|---|---|---|---|---|---|
| Example | 11 | Example 1 | 100 | OK | A | 8.0 |
|  | 12 | Example 2 | 100 | OK | A | 10.2 |
|  | 13 | Example 3 | 100 | OK | A | 8.5 |
|  | 14 | Example 4 | 100 | OK | A | 9.3 |
|  | 15 | Example 5 | 100 | OK | A | 7.9 |
|  | 16 | Example 6 | 100 | OK | A | 8.5 |
|  | 17 | Example 7 | 100 | OK | A | 7.7 |
|  | 18 | Example 8 | 100 | OK | A | 8.5 |
|  | 19 | Example 9 | 100 | OK | A | 8.3 |
| Comparative | 11 | Comparative Example 1 | 100 | NG | A | 8.3 |
| Example | 12 | Comparative Example 2 | 100 | OK | B | 8.9 |
|  | 13 | Comparative Example 3 | 100 | OK | A | 7.9 |
|  | 14 | Comparative Example 4 | 100 | OK | B | 8.9 |
|  | 15 | Comparative Example 5 | 100 | OK | A | 9.4 |
|  | 16 | Comparative Example 6 | 100 | NG | A | 9.7 |
|  | 17 | Comparative Example 7 | 100 | NG | A | 9.5 |
|  | 18 | Comparative Example 8 | 100 | OK | B | 6.3 |
|  | 19 | Comparative Example 9 | 100 | OK | A | 8.2 |
| Conventional Example 11 | | Conventional Example 1 | 100 | OK | B | 2.9 |

In the multilayer wiring films of Comparative Examples 11 and 17 including the protective films that were formed using the sputtering targets for forming a protective film of Comparative Examples 1 and 7 in which the sum of the Ni content and the Al content was lower than 5 mass %, the discoloration was observed in the temperature- and humidity-controlled test, and weather resistance was insufficient.

In the sputtering target for forming a protective film of Comparative Example 2 in which the Ni content was higher than those of Examples, cracking was observed during hot rolling. In addition, in the multilayer wiring film of Comparative Example 12 including the protective film that was formed using the sputtering target for forming a protective film of Comparative Example 2, a residue remained after etching.

In the sputtering target for forming a protective film of Comparative Example 3 in which the Mn content was lower than those of Examples, cracking was observed during hot rolling.

In the multilayer wiring film of Comparative Example 14 including the protective film that was formed using the sputtering target for firming a protective film of Comparative Example 4 in which the Mn content was higher than those of Examples, a residue remained after etching.

In the sputtering target for forming a protective film of Comparative Example 5 in which the Fe content was lower than those of Examples, cracking was observed during hot rolling.

In the multilayer wiring film of Comparative Example 16 including the protective film that was formed using the sputtering target for forming a protective film of Comparative Example 6 in which the Fe content was higher than those of Examples, the discoloration was observed in the temperature- and humidity-controlled test, and weather resistance was insufficient.

In the sputtering target for forming a protective film of Comparative Example 8 in which the sum of the Ni content and the Al content was higher than 15 mass %, cracking was observed during hot rolling. In addition, in the multilayer wiring of Comparative Example 18 including the protective film that was formed using the sputtering target for forming a protective film of Comparative Example 8, a residue remained after etching.

In the sputtering target for forming a protective film of Comparative Example 9 in which 15 mass % of Al was added without adding Ni, cracking was observed during hot rolling.

Further, in the multilayer wiring film of Conventional Example 11 in which the protective film was formed using the sputtering target of Conventional Example 1 including 64 mass % of Ni; 4 mass % of Ti; and a balance including Cu and inevitable impurities, a residue remained after etching. In addition, the etching rate was slow, and etchability was poor.

On the other hand, in the sputtering targets for forming a protective film of Examples 1 to 9 in which the contents of Ni, Mn, Fe, and Al were in the range of the present invention, cracking was not observed during hot working, and the sputtering target for forming a protective film was able to be manufactured favorably.

In the multilayer wiring films of Examples 11 to 19 including the protective films that were formed using the sputtering targets for forming a protective film of Examples 1 to 9, adhesion, weather resistance, and etchability were superior.

From the above results, the following facts were found. According to the sputtering targets for forming a protective of Examples, a protective film which has superior weather resistance, can suppress surface discoloration, and has superior etchability can be formed. It is also possible to provide sputtering target for forming a protective film which is formed of a copper alloy that has superior hot workability, has no cracks and the like, and can suppress abnormal discharge; and a multilayer wiring film including a protective film that is formed using the sputtering target for forming a protective film.

INDUSTRIAL APPLICABILITY

With the sputtering target for firming a protective film according to the present invention, even in a case where the formed protective film is etched with an etchant containing iron chloride, etching can be performed as in the case of a Cu wiring film, and the production of an unmelted residue can be suppressed. Further, since the sputtering target for forming a protective film does not contain Cr, waste liquid after etching can be treated at a low cost.

REFERENCE SIGNS LIST

1: SUBSTRATE
10: MULTILAYER WIRING FILM
11: Cu WIRING FILM
12: PROTECTIVE FILM
13: GLASS SUBSTRATE
14: RESIDUE

The invention claimed is:

1. A sputtering target for forming a protective film which is used for forming a protective film on a single surface or both surfaces of a Cu wiring film, the sputtering target consisting of:
   9.8 to 12.0 mass % of Ni;
   0.6 to 5.0 mass % of Mn;
   0.5 to 7.0 mass % of Fe; and
   a balance including Cu and inevitable impurities.
2. A multilayer wiring film, comprising:
   a Cu wiring film; and
   a protective film that is formed on a single surface or both surfaces of the Cu wiring film,
   wherein the protective film is formed using the sputtering target for forming a protective film according to claim 1.

* * * * *